US008274228B2

(12) United States Patent
MacDonald et al.

(10) Patent No.: US 8,274,228 B2
(45) Date of Patent: Sep. 25, 2012

(54) FLOW TUBE APPARATUS

(75) Inventors: Mark MacDonald, Beaverton, OR (US);
Rajiv K. Mongia, Fremont, CA (US);
David B. Go, South Bend, IN (US)

(73) Assignee: Intel Corporation, Santa Clara, CA (US)

( * ) Notice: Subject to any disclaimer, the term of this patent is extended or adjusted under 35 U.S.C. 154(b) by 397 days.

(21) Appl. No.: 12/647,331

(22) Filed: Dec. 24, 2009

(65) Prior Publication Data

US 2011/0157813 A1    Jun. 30, 2011

(51) Int. Cl.
*H01J 7/24* (2006.01)
(52) U.S. Cl. .................. 315/111.91; 315/160; 315/167; 315/111.81
(58) Field of Classification Search .............. 315/32, 315/33, 40, 111.81, 111.91, 117, 160, 167, 315/334, 340, 357, 358
See application file for complete search history.

(56) References Cited

U.S. PATENT DOCUMENTS

| 5,077,500 | A | * | 12/1991 | Torok et al. ............. 315/111.91 |
| 2008/0197779 | A1 | | 8/2008 | Fisher et al. |
| 2009/0086423 | A1 | | 4/2009 | Mongia et al. |
| 2009/0168332 | A1 | | 7/2009 | Mongia |
| 2009/0190302 | A1 | | 7/2009 | Bhattacharya et al. |
| 2009/0190308 | A1 | | 7/2009 | Bhattacharya et al. |
| 2010/0116460 | A1 | * | 5/2010 | Jewell-Larsen et al. ........ 165/47 |

OTHER PUBLICATIONS

H. Kalaman et al., "Enhancement of heat transfer by means of a corona wind created by a wire electrode and confined wings assembly," Applied Thermal Engineering 21 (2001) pp. 265-282.
A. Rashkovan et al., "Experimental optimization of an electric blower by corona wind," Applied Thermal Engineering 22 (2002) pp. 1587-1599.
N.E. Jewell-Larsen et al., "Design and Optimization of Electrostatic Fluid Accelerators," IEEE Transactions on Dielectrics and Electrical Insulation, vol. 13, No. 1; Feb. 2006, pp. 191-203.
Chih-Peng Hsu, et al., "Miniaturization of Electrostatic Fluid Accelerators," Journal of Microelectromechanical Systems, vol. 16, No. 4, Aug. 2007, pp. 809-815.
C.P. Hsu et al., "Heat Transfer Enhancement Measurement for Microfabricated Electrostatic Fluid Accelerators," 24$^{th}$ IEEE Semi-Therm Symposium, 2008, pp. 32-38.
Dan Schlitz et al., "An Electro-Aerodynamic Solid-State Fan and Cooling System," 24$^{th}$ IEEE Semi-Therm Symposium, 2008, pp. 46-49.

* cited by examiner

*Primary Examiner* — Douglas W Owens
*Assistant Examiner* — Jianzi Chen
(74) *Attorney, Agent, or Firm* — KED & Associates, LLP

(57) ABSTRACT

A flow tube apparatus may include a flow tube having a first opening and a second opening, a corona electrode provided in the flow tube, a collecting electrode provided in the flow tube, and at least one focusing electrode provided in the flow tube to guide ions and thereby provide an ionic wind. In at least one embodiment, the flow tube apparatus may be provided in an electronic apparatus to provide an air flow.

24 Claims, 4 Drawing Sheets

FLOW TUBE APPARATUS

FIELD

Embodiments of the present invention may relate to a flow tube apparatus.

BACKGROUND

Electronic components and systems operate at faster speeds. These and other developments, such as processors with one or more cores, may provide better performance, decrease size and weight of components, and increase density of components. These factors may increase the heat generated by electronic components and the systems in which they reside. This may be particularly true in mobile devices or small computing environments, where these factors can lead to overheating, which can negatively affect performance, user performance and significantly reduce battery life.

Cooling of electronic components (or circuits) may be achieved by moving heat away from an electronic component, such as a chip, via a heat spreader and a heat sink and then cooling the heat sink through forced convection (i.e., a fan). However, this may be difficult as components scale down and cooling requirements become more stringent. Additionally, fans and heat sinks may not be available for use with mobile internet devices (MIDs).

BRIEF DESCRIPTION OF THE DRAWINGS

The following represents brief descriptions of the drawings in which like reference numerals represent like elements and wherein.

DETAILED DESCRIPTION

Figure 1:
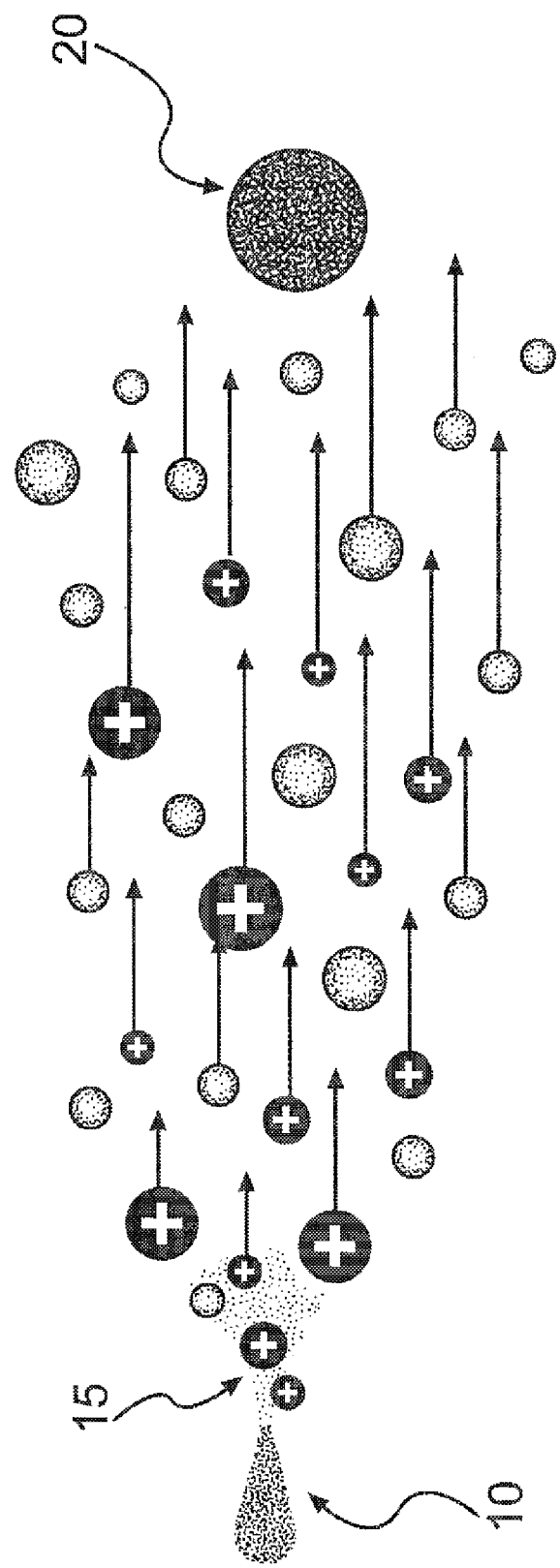
FIG. 1 shows an ion stream of an electrostatic fluid accelerator according to an example arrangement.

In the following detailed description, like reference numerals and characters may be used to designate identical, corresponding and/or similar components in differing figure drawings. Further, in the detailed description to follow, example sizes/models/values/ranges may be given although embodiments are not limited to the same. Where specific details are set forth in order to describe example embodiments, it should be apparent to one skilled in the art that embodiments may be practiced without these specific details.

Cooling of electronic components (and circuits) may be achieved by using an electrohydrodynamic flow tube (EFT) to generate an ionic wind (or air flow). As one example, the EFT may have a duct height of less than 2 mm, for example.

Ionic wind may cool electronic components (and circuits) within an electronic apparatus. The generation of the ionic wind (or air flow) may be based on principles of gas-phase electrohydrodynamics. Ionic wind may offer air propulsion with dynamic air flow profiles and controllable air velocities. The ionic air propulsion may be achieved without moving mechanical parts, thus enabling a flexible design. The ionic wind may enhance convection cooling of the electronic components.

FIG. 1 shows an ion stream of an electrostatic fluid accelerator according to an example arrangement. Other arrangements may also be provided. This figure may show corona-induced ionic wind propulsion. The electrostatic fluid accelerator, or ionic wind pump, may be used for the air propulsion.

More specifically, FIG. 1 shows a corona electrode 10 and a collecting electrode 20, as well as positively ionized air particles (labeled with +) and non-ionized, neutral air particles. A corona discharge region 15 may be near the corona electrode 10. As one example, the corona electrode 10 may be a high tip curvature corona electrode and the collecting electrode 20 may be a low tip curvature collecting electrode.

The air propulsion may now be described. Gas molecules at or near the corona discharge region 15 may become ionized when a high intensity electric field is applied between the corona electrode 10 and the collecting electrode 20. The ionized gas molecules may travel towards the collecting electrode 20, colliding with neutral air molecules. Based on these collisions, momentum may be transferred from the ionized gas molecules to neutral air molecules, resulting in movement of gas in a direction towards the collecting electrode 20. This may be considered air flow or ionic wind. The corona induced air flow may be provided based on a positive voltage applied to one of the corona electrode 10 or the collecting electrode 20 and a negative voltage applied to the other one of the corona electrode 10 and the collecting electrode 20. The selection of polarity may depend on factors such as electrode material, device geometry, ozone generation constraints, and/or etc.

FIG. 1 shows that an ionic wind or air flow may be generated using two different types of electrodes, namely the corona electrode 10 and the collecting electrode 20. These principles of generating an ionic wind may be applied to an electrohydrodynamic flow tube as will be described below.

Figure 2A:
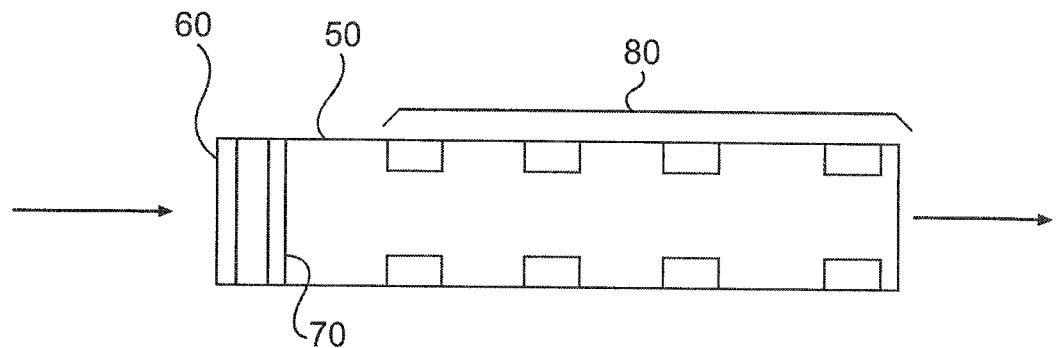
FIG. 2A shows a flow tube apparatus that includes a flow tube and three different types of electrodes according to an example embodiment.
Figure 2B:
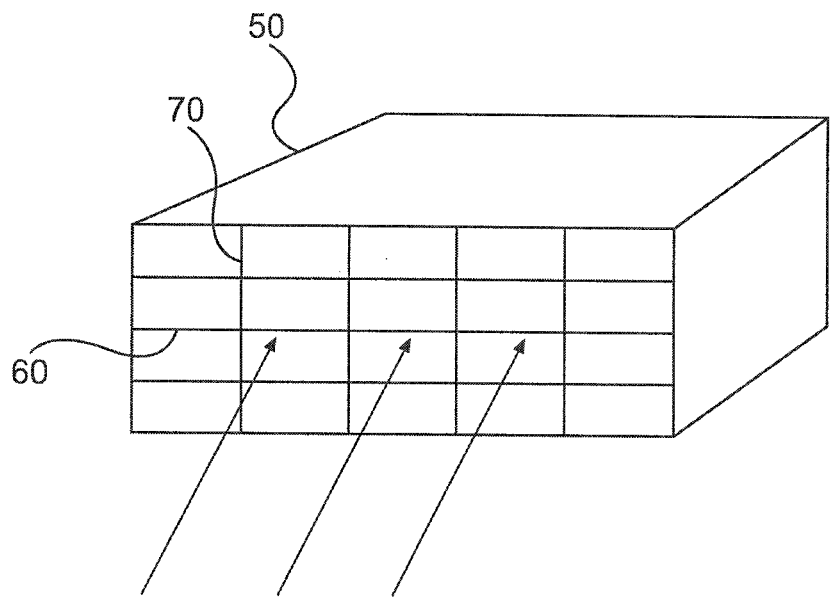
FIG. 2B shows corona electrodes and collecting electrodes.

FIG. 2A shows a flow tube apparatus that includes a flow tube and three different types of electrodes according to an example embodiment of the present invention. FIG. 2B shows corona electrodes and collecting electrodes that create a corona discharge. Other embodiments and configurations may also be within the scope of the present invention. The flow tube apparatus shown in FIG. 2A may be used to generate an ionic wind (or air flow).

In FIG. 2A and the following figures (such as FIGS. 3, 4A-4D and 5A-5B), the air flow (or the ionic wind) may be described as moving in a direction shown by the arrows, such as from a flow tube entrance (i.e., a first opening) to a flow tube exit (i.e., a second opening). For ease of description, the flow tube may hereafter be described as a four sided tube or a four walled tube. However, other numbers of sides (or walls) and/or shape of the flow tube are also within the scope of the present invention. The flow tube may be considered an Electrohydrodynamic Flow Tube (EFT).

More specifically, FIG. 2A shows a flow tube 50 (or an EFT) that generates an ionic wind (or air flow) by using three different types of electrodes, namely corona electrodes 60, collecting electrodes 70 and a plurality of focusing electrodes 80. The corona electrodes 60 and the collecting electrodes 70 may collectively be referred to as corona discharge (or ion-generation) electrodes. The corona discharge electrodes may ionize gas molecules and accelerate an air flow through the flow tube 50 (in a left-to-right manner as shown by the arrows in FIG. 2A) in a similar manner as described above with respect to FIG. 1. The ionizing of the gas molecules and movement thereof may be achieved by positive and negative voltages applied to the corona electrodes 60 and the collecting electrodes 70. The corona electrodes 60 and the collecting electrodes 70 provide a movement of ions (or gas molecules).

The corona electrodes 60 may be provided in the flow tube 50 and the collecting electrodes 70 may be provided in the flow tube 50. The corona electrodes 60 may be thin lateral corona wires that extend between side walls (or side surfaces) of the flow tube 50, and the collecting electrodes 70 may be blunt vertical collecting wires that extend between top and bottom walls (or surfaces) of the flow tube 50. The collecting electrodes 70 may be downstream from the corona electrodes 60 in a direction away from the first opening and toward the second opening. The corona electrodes 60 may be formed as a mesh or a plurality of meshes), and the collecting electrodes 70 may be formed as a separate mesh. Other configurations of the corona electrodes 60 and the collecting electrodes 70 may also be provided.

The focusing electrodes 80 may be a series of electrodes provided along a longitudinal length of the flow tube 50. The focusing electrodes 80 may be provided downstream from the corona electrodes 60 and the collecting electrodes 70. The focusing electrodes 80 may be in a direction away from the first opening and toward the second opening. Each of the focusing electrodes 80 may receive an electric potential (or voltage) so that ions (or ionized gas molecules) may focus or be guided toward a center area of the flow tube 50 and so that the ions (or ionized gas molecules) may move along the longitudinal length of the flow tube 50 in a direction toward the flow tube exit (i.e., toward the second opening). Accordingly, the focusing electrodes 80 may be provided in the flow tube to guide the ions in a direction toward the second opening. The ions may therefore have an increased residence time in the flow tube 50 and thereby may allow a greater momentum transfer to air.

The focusing electrodes 80 may be a multi-electrode configuration. The focusing electrodes 80 may reduce ion losses to wall surfaces (i.e., top, bottom and side walls or surfaces) of the flow tube 50. The focusing electrodes 80 may maximize (or increase) an ion drag effect through more collisions between the ions and neutral air molecules. The focusing electrodes 80 may increase air flow (or an ionic wind) along the longitudinal length of the flow tube 50 toward the flow tube exit (i.e., toward the second opening). The focusing electrodes 80 may focus or guide the ions toward a center area of the flow tube 50 to keep the ions away from walls (or surfaces) of the flow tube 50. The focusing electrodes 80 may increase the ion flow rate through the flow tube 50. This ionic wind or air flow may be air propulsion to cool electronic components (that generate heat) that are thermally coupled to the flow tube 50.

The focusing electrodes 80 may create an assisted discharge to attract or guide the ions. That is, the corona discharge electrodes may create a primary corona discharge and the assisted discharge may be created by the focusing electrodes 80 to attract or guide the ions in a direction away from the collecting electrodes 70 and toward the second opening. The focusing electrodes 80 may provide an assist discharge to the ionized gas molecules. This may increase an ion net current out from the corona discharge region 15. The assisted discharge created by the focusing electrodes 80 may create a higher flow velocity and may consume less power than a discharge between the corona electrodes 60 and the collecting electrodes 70. The focusing electrodes 80 may also provide an increasing space charge density in a region downstream from the collecting electrodes 70, and thus may result in higher mass flow rates. The three electrode type flow tube (or EFT) may have a lower power consumption and greater electrical efficiency than a two electrode type flow tube, which only includes corona discharge electrodes (and does not include focusing electrodes).

A corona discharge may be created within the flow tube 50 by applying an electronic field between a corona electrode and a collecting electrode. An assisted discharge may be provided to ionize gas molecules by applying voltages to at least one focusing electrode located within the flow tube 50. The assisted discharge may guide the ionized gas molecules toward a central area of the flow tube. The assisted discharge may guide the ionized gas molecules along the flow tube and toward an opening of the flow tube 50.

Figure 3:
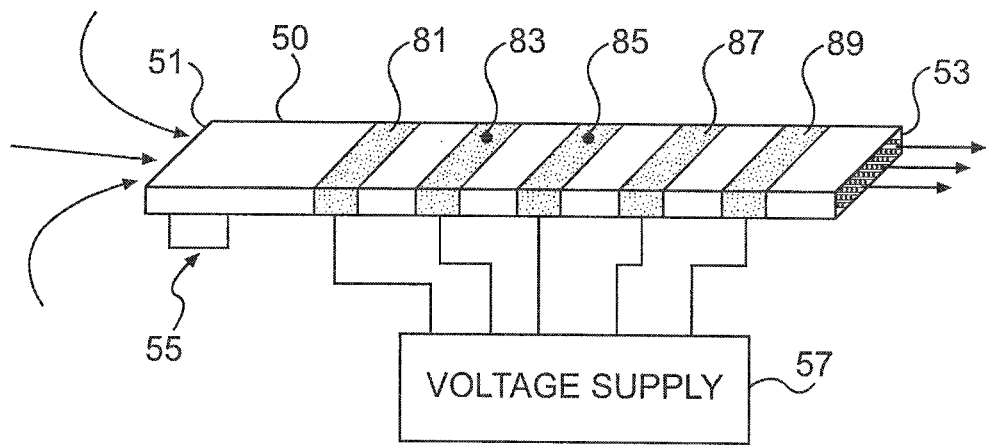
FIG. 3 shows a flow tube apparatus according to an example embodiment.

FIG. 3 shows a flow tube apparatus that includes a flow tube (or EFT) having three types of electrodes according to an example embodiment of the present invention. Other embodiments and configurations are also within the scope of the present invention.

More specifically, FIG. 3 shows the flow tube 50 having the corona discharge electrodes (not specifically shown in FIG. 3) provided in the flow tube 50 at an area 55 and a plurality of focusing electrodes 81, 83, 85, 87, 89 provided along a longitudinal length of the flow tube 50. Each of the focusing electrodes may be a separate electrode provided at a different area around an inner surface area of the flow tube 50. Each of the focusing electrodes 80 may be parallel to each other. Additionally, each of the focusing electrodes 80 may receive a different voltage from a voltage supply 57, which may or may not be considered as part of the flow tube apparatus. FIG. 3 also shows an ionic wind (or air flow) from a first opening 51 toward a second opening 53.

FIG. 3 shows that the focusing electrodes may include a first focusing electrode 81, a second focusing electrode 83, a third focusing electrode 85, a fourth focusing electrode 87 and a fifth focusing electrode 89. Other numbers of focusing electrodes may also be provided along the flow tube 50.

A different voltage may be provided to each of the focusing electrodes 81, 83, 85, 87 and 89 by using a voltage source 57 (or power source) or a plurality of voltage sources (or power sources). For example, the first focusing electrode 81 may receive a voltage V volts, the second focusing electrode 83 may receive a voltage of (3/4)V volts, the third focusing electrode 85 may receive a voltage of (1/2)V volts, the fourth focusing electrode 87 may receive a voltage of (1/4)V volts and the fifth focusing electrode 89 may receive a voltage of (0/4)V volts. Thus, the focusing electrodes may receive a gradually decreasing voltage to improve the ionic wind effect. Other voltages are also within the scope of the present invention.

As another example, the first focusing electrode 81 may receive a high voltage, the second focusing electrode 83 may receive a low voltage, the third focusing electrode 85 may receive a high voltage, the fourth focusing electrode 87 may receive a low voltage and the fifth focusing electrode 89 may receive a high voltage. Thus, the focusing electrodes may receive a high-low-high-low voltage pattern to create a focusing effect. Other voltages may also be applied to the plurality of focusing electrodes.

The application of these voltages to the focusing electrodes 81, 83, 85, 87 and 89 may also serve to redirect ions away from walls (or surfaces) of the flow tube 50 and this may increase ion residence time and increase momentum exchange between the ions and neural molecules and thereby increase air flow. The application of these voltages to the focusing electrodes may also enhance the electric field in the focusing region (i.e., near the focusing electrodes) and thereby increase the air flow. The application of these voltages may serve to modify the electric field to create an assisted discharge and thereby increase the ion current in a direction toward the second opening 53.

The focusing electrodes may be made of metal. As one example, the focusing electrodes may be a copper tape. Other types of focusing electrodes may also be used.

While FIG. 3 shows parallel focusing electrodes around inner walls (or surfaces) of the flow tube 50, other configurations of the focusing electrodes may also be provided. FIGS. 4A-4D are top views of the flow tube 50 showing different configurations of the focusing electrodes 80 according to example embodiments of the present invention. For ease of description, the flow tube 50 is described as having 4 walls (or surfaces), namely a top wall, a bottom wall and 2 side walls. However, other numbers of walls (or surfaces) may also be provided. Further, the flow tube 50 may be provided in different forms, such as a circular shape.

Figure 4A:
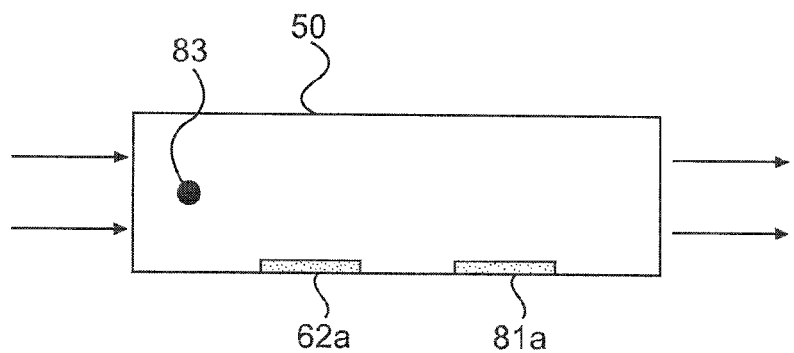
FIGS. 4A-4D are top views of a flow tube showing different configurations of focusing electrodes according to example embodiments of the present invention.
Figure 4B:
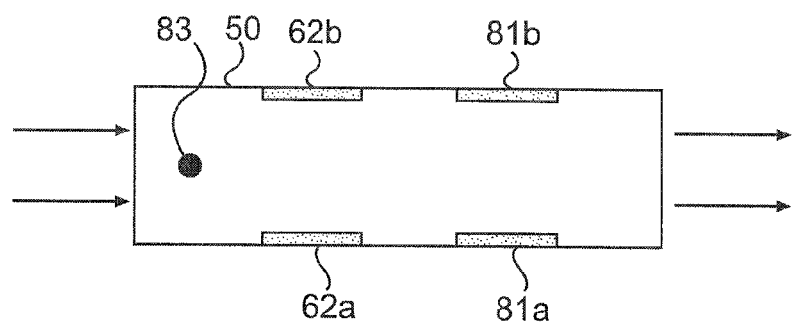
Figure 4C:
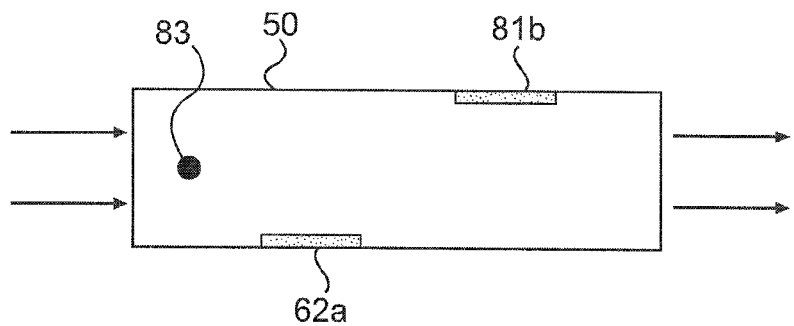
Figure 4D:
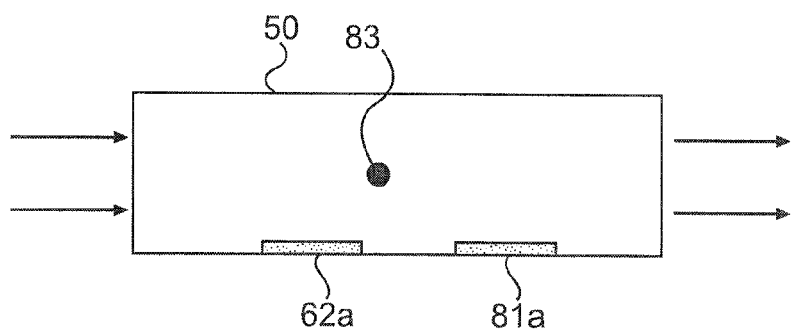

FIG. 4A shows the flow tube 50 in which the focusing electrode 81a is provided downstream from the collecting electrode 62a (and a corona electrode 83) and on a same side of the flow tube 50. FIG. 4B shows the flow tube 50 in which the focusing electrodes 81a is provided on one side wall and downstream from the collecting electrodes 62a and focusing electrode 81b is provided on an opposite side wall and downstream from the collecting electrodes 62b. FIG. 4C shows the flow tube 50 in which the focusing electrode 81b is provided downstream from the collecting electrodes 62a and on a different side wall. FIG. 4D shows the flow tube 50 in which the collecting electrode 62a is upstream from the corona electrode 83 and the focusing electrode 81a is on a same side of the flow tube 50 and downstream from the corona electrode 83.

A flow tube apparatus that includes the flow tube 50 having three different types of electrodes may be provided within an electronic apparatus to providing cooling of electronic components within the electronic apparatus based on the generated ionic wind. For example, the flow tube apparatus may be provided within a portable electronic apparatus, such as an ultramobile computer, a mobile internet device, a laptop, a notebook, a netbook, a nettop, and/or other electronics. The flow tube 50 may be embedded within a channel of the electronic apparatus (or system) so as to maintain the electronics' isolation from an external environment.

The flow tube 50 may be embedded in an ultramobile computing platform, for example. The flow tube 50 may have no moving parts, and may create a bulk air flow by ionizing air molecules and accelerating the ionized molecules past a cascaded series of electrodes that focus and guide the ions along a ducted passage. The flow tube 50 may be a narrow duct that runs through the system chassis. As one example, the flow tube 50 may have a height (or thickness) of 1 mm and may have a width of 30 mm wide. As another example, the flow tube 50 may have a height of less than 2 mm.

Heat producing electronic components (within the electronic apparatus) may be thermally coupled to walls (or surfaces) of the flow tube 50, thus transferring heat to the flow tube 50. The flow tube 50 may not have any openings to internal components of the electronic apparatus, and may extend straight through an entire length of the electronic apparatus (or system), such as from a first opening to a second opening. The flow tube apparatus may generate air flow (or an ionic wind) to cool electronic components within the electronic apparatus.

Figure 5A:
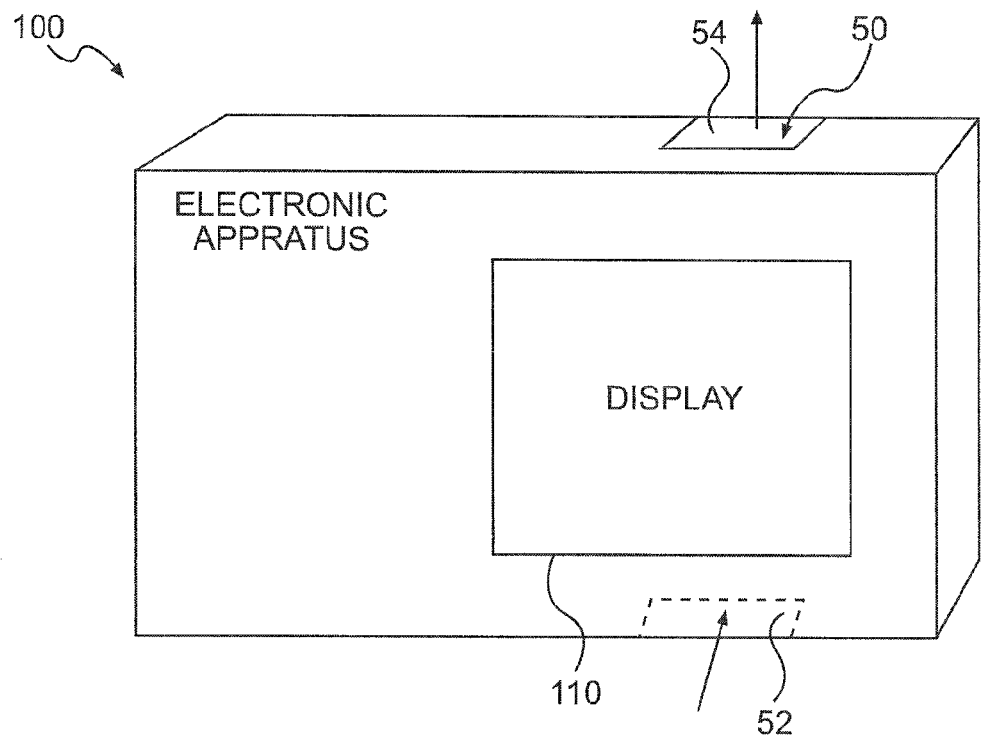
FIG. 5A shows a front view of an electronic apparatus having a flow tube according to an example embodiment of the present invention.
Figure 5B:
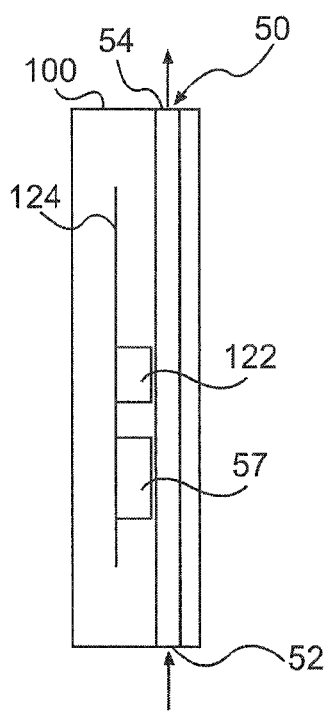
FIG. 5B shows a side view of the electronic apparatus of FIG. 5A.

FIGS. 5A and 5B show an electronic apparatus having a flow tube apparatus according to an example embodiment of the present invention. Other embodiments and configurations are also within the scope of the present invention.

More specifically, FIG. 5A shows an electronic apparatus 100 that includes a display 110 on a front surface, other electronic components that generate heat (not shown in FIG. 5A) within the electronic apparatus 100 and the flow tube 50 within the electronic apparatus 100. The focusing electrodes of the flow tube 50 may receive power or voltage from a same source (such as a battery) as other components of the electronic apparatus 100. FIG. 5A shows an air flow from a first opening 52 and out of a second opening 54.

FIG. 5B shows a side view of the electronic apparatus 100. As shown, the electronic components may include a processor 122 and the voltage source 57 provided on a circuit board 124. Other components and circuit boards may also be provided. The flow tube 50 may be provided adjacent the processor 122 so as to cool the processor 122 and/or other components based on the air flow through the flow tube 50. An outer wall (or surface) of the flow tube 50 may be provided adjacent to the processor 122 so as to provide a thermal coupling between the flow tube 50 and the processor 122. The flow tube 50 may be thermally coupled to the electronic components through a thermal interface material and spreader, and/or a thermal interface material and heat pipe, and/or be in direct contact with the electronic components through use of a thermal interface material or gap filler material.

As discussed above, an air flow (or ionic wind) may be generated by the flow tube 50 and the three different types of electrodes. The air flow may provide a cooling effect on the processor 122 and other components by removing hot air and/or circulating cooler air thru the flow tube 50. Air may flow through the whole system, bring in cold air, heat that air, and then remove that hot air.

The flow tube 50 may extend across an entire height, width, depth or length of the electronic apparatus 100. As shown in FIGS. 5A and 5B, the flow tube 50 may have a flow tube entrance (i.e., the first opening 52) and a flow tube exit (i.e., the second opening 54).

The flow tube apparatus may be provided within a mobile computing device such as a laptop computer, a cell phone, a personal digital assistant, and/or other similar device with on-board processing power and wireless communications ability and that is powered by a power source (or voltage source), such as a fuel cell or a battery.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments of the present invention have been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A flow tube apparatus comprising:
a flow tube having an opening;
a corona electrode;
a collecting electrode, the corona electrode and the collecting electrode to provide a movement of ions in the flow tube; and
a plurality of focusing electrodes to be provided in the flow tube to guide the ions in a direction toward the opening, and a first one of the focusing electrodes to receive a first voltage and a second one of the focusing electrodes to receive a second voltage.

2. The flow tube apparatus of claim 1, further comprising at least one voltage supply to provide the first voltage to the first one of the focusing electrodes and to provide the second voltage to the second one of the focusing electrodes.

3. The flow tube apparatus of claim 1, wherein the plurality of focusing electrode electrodes to guide the ions toward a central area of the flow tube.

4. The flow tube apparatus of claim 1, wherein the plurality focusing electrodes to guide the ions along the flow tube in the direction away from the collecting electrode and toward the opening.

5. The flow tube apparatus of claim 1, wherein the corona electrode and the collecting electrode to ionize gas molecules based on an electronic field applied between the corona electrode and the collecting electrode.

6. The flow tube apparatus of claim 1, wherein the flow tube has a height of less than 2 mm.

7. The flow tube apparatus of claim 1, wherein the flow tube is an electrohydrodynamic flow tube.

8. The flow tube apparatus of claim 1, wherein each of the focusing electrodes is a separate electrode provided at a different area around an inner surface of the flow tube.

9. The flow tube apparatus of claim 8, wherein each of the focusing electrodes is parallel to each other.

10. An electronic apparatus comprising:
an electronic component to generate heat;
a flow tube apparatus to provide an air flow from a first opening to a second opening; and
a voltage supply to supply power to the electronic component and to the flow tube apparatus,
wherein the flow tube apparatus includes:
a flow tube,
a corona electrode and a collecting electrode to ionize gas molecules in the flow tube, and
a plurality of focusing electrodes to provide an assist discharge to the ionized gas molecules, and a first one of the focusing electrodes to receive a first voltage from the voltage supply and a second one of the focusing electrodes to receive a second voltage from the voltage supply.

11. The electronic apparatus of claim 10, wherein the plurality of focusing electrodes to be provided in the flow tube.

12. The electronic apparatus of claim 10, wherein the plurality of focusing electrodes to focus the ionized gas molecules toward a central area of the flow tube.

13. The electronic apparatus of claim 10, wherein the plurality of focusing electrodes to guide the ionized gas molecules in a direction away from the collecting electrode and toward the second opening.

14. The electronic apparatus of claim 10, wherein the corona electrode and the collecting electrode to ionize gas molecules based on an electronic field applied between the corona electrode and the collecting electrode.

15. The electronic apparatus of claim 10, wherein the flow tube has a height of less than 2 mm.

16. The electronic apparatus of claim 10, wherein the electronic component comprises a processor.

17. The electronic apparatus of claim 10, wherein the electronic apparatus is a mobile Internet device.

18. The electronic apparatus of claim 10, wherein the flow tube is an electrohydrodynamic flow tube.

19. The electronic apparatus of claim 10, wherein each of the focusing electrodes is a separate electrode provided at a different area around an inner surface of the flow tube.

20. The electronic apparatus of claim 19, wherein each of the focusing electrodes is parallel to each other.

21. A method comprising:
providing a corona discharge in a flow tube by applying an electronic field between a corona electrode and a collecting electrode; and
providing an assisted discharge to ionize gas molecules in the flow tube by applying a voltage to at least one focusing electrode.

22. The method of claim 21, wherein the assisted discharge to guide the ionized gas molecules toward a central area of the flow tube.

23. The method of claim 21, wherein the assisted discharge to guide the ionized gas molecules along the flow tube and toward an opening of the flow tube.

24. The method of claim 21, wherein the flow tube is an electrohydrodynamic flow tube.

* * * * *